United States Patent [19]

Inoue et al.

[11] Patent Number: 5,128,444

[45] Date of Patent: * Jul. 7, 1992

[54] THERMOSETTING RESIN COMPOSITION AND THERMOSETTING DRY FILM

[75] Inventors: Hiroshi Inoue; Tadao Muramatsu; Tetsuji Hirano, all of Oosaka, Japan

[73] Assignee: Ube Industries, Ltd., Yamaguchi, Japan

[*] Notice: The portion of the term of this patent subsequent to Oct. 16, 2007 has been disclaimed.

[21] Appl. No.: 510,016

[22] Filed: Apr. 17, 1990

[30] Foreign Application Priority Data

Apr. 18, 1989 [JP] Japan .................................. 1-96251

[51] Int. Cl.$^5$ ...................... C08C 69/26; C08C 63/00; C08C 2/00; C08C 12/00
[52] U.S. Cl. ................................. 528/353; 528/170; 528/179; 528/182; 528/188; 528/220; 528/222; 528/224; 528/229; 528/342; 528/352; 428/473.5
[58] Field of Search ............... 528/353, 352, 342, 229, 528/220, 224, 222, 188, 182, 179, 170; 428/473.5

[56] References Cited

U.S. PATENT DOCUMENTS

| 4,061,856 | 12/1977 | Hsu ..................... | 528/342 |
| 4,159,262 | 6/1979 | Hsu ..................... | 528/342 |
| 4,173,700 | 11/1979 | Green et al. ............ | 528/342 |
| 4,963,645 | 10/1990 | Inoue et al. ............ | 528/353 |

FOREIGN PATENT DOCUMENTS

| 0304913 | 3/1989 | European Pat. Off. . |
| 0357367 | 3/1990 | European Pat. Off. . |
| 1054029 | 3/1989 | Japan . |
| 6454030 | 3/1989 | Japan . |
| 1188528 | 7/1989 | Japan . |
| 1247430 | 10/1989 | Japan . |

Primary Examiner—Morton Foelak
Assistant Examiner—P. Hampton-Hightower
Attorney, Agent, or Firm—McAulay Fisher Nissen Goldberg & Kiel

[57] ABSTRACT

A thermosetting resin composition, a solution composition of the resin and a thermosetting dry film formed out of the resin are disclosed. The thermosetting resin composition contains a specific resin component as the main component. The resin component consists of (A) 100 weight parts of an aromatic polyimide; and (B) 5 to 2,000 weight parts of (a) a terminal-modified imide oligomer or (b) an unsaturated imide compound. The aromatic polyimide (A) is formed from a tetracarboxylic acid ingredient which contains 2,3,3',4'-biphenyltetracarboxylic acid or its derivative in an amount of at least 60 mole % and an aromatic diamine ingredient. The polyimide has such a high molecular weight that the logarithmic viscosity (concentration: 0.5 g/100 ml of solvent; solvent: N-methyl-2-pyrrolidone; and temperature of measurement: 30° C.) is not less than 0.2. The polyimide is soluble in an organic polar solvent. The imide oligomer (a) has an internal imide bond inside of the oligomer and an unsaturated group as a terminal group, and is formed by a reaction of an aromatic tetracarboxylic acid ingredient, a diamine ingredient, and an unsaturated monoamine or dicarboxylic acid ingredient having an unsaturated group. The oligomer has a logarithmic viscosity of not more than 0.5 and a softening point of not higher than 300° C. The imide compound (b) has an internal imide bond inside of the compound and an unsaturated group as a terminal group, and is formed by a reaction of an aromatic tetracarboxylic acid ingredient with a monoamine ingredient having an unsaturated group. The compound has a softening point of not higher than 300° C.

13 Claims, No Drawings

THERMOSETTING RESIN COMPOSITION AND THERMOSETTING DRY FILM

FIELD OF THE INVENTION

The present invention relates to a thermosetting resin composition which contains as the main component a heat-resistant imide resin component consisting of a soluble aromatic polyimide having a high molecular weight and a terminal-modified imide oligomer having an unsaturated group as a terminal group or an unsaturated imide compound.

The resin composition of the invention is soluble in an organic polar solvent as well as thermosetting. The resin composition has such a melting point that the composition is advantageously used as an adhesive. Further, the melting point of the composition is convenient for molding. Furthermore, the composition of the invention can be advantageously used as an excellent heat-resistant adhesive for preparation of various composites (such as a complex material of polyimide film and copper foil or copper wire), since the heat-cured product made from the thermosetting resin composition containing an aromatic polyimide having a high molecular weight shows an excellent mechanical property.

BACKGROUND OF THE INVENTION

In general, an aromatic polyimide having a high molecular weight is highly heat-resistant. Accordingly, the aromatic polyimide is employed for various applications requiring heat-resistance.

On the other hand, the aromatic polyimide is usually low in solubility in an organic solvent. Further, the polyimide has an extremely high softening point or has no softening point. Therefore, the polyimide is not appropriate for molding, and it is difficult to use in combination with another resin for various applications.

For the reasons mentioned above, a solution of an aromatic polyamic acid in an organic solvent has been proposed and used in place of the aromatic polyimide for various applications. The aromatic polyamic acid is a precursor of the aromatic polyimide having a high molecular weight. However, the aromatic polyamic acid requires an imide ring closure to be converted into an aromatic polyimide. The ring closure reaction forms water, which should be removed. The process for removing water causes some troubles.

On the other hand, a terminal-modified imide oligomer which has a relatively small molecular weight and an unsaturated group as a terminal group or an unsaturated imide compound is excellently soluble in an organic solvent as well as thermosetting. Further, the imide oligomer or the imide compound has a relatively low softening point. Therefore, the imide oligomer or compound has been proposed to be used as an adhesive, while it is difficult to use the aromatic polyimide having a high molecular weight as an adhesive.

The above-mentioned known terminal-modified imide oligomer and the unsaturated imide compound are hard and fragile. Therefore, the mechanical property of the heat-cured product made from the oligomer or compound is inferior.

Recently, a thermosetting resin composition comprises a soluble aromatic polyimide made from benzophenone tetracarboxylic acid or its derivative and an imide oligomer made from bismaleimide or its derivative has been proposed in Japanese Patent Provisional Publications No. 62(1987) 30122 and No. 62(1987) 179558. The heat-cured product a improved in the mechanical property is accessible from therein composition.

But, the resin composition proposed in the Publications should be used together with phenol or its derivative as an organic solvent. The resin composition is low in solubility in a usual organic polar solvent. Further, the heat-resistance of the heat-cured product made from the composition is low.

SUMMARY OF THE INVENTION

An object of the invention is to provide a thermosetting resin composition which solves the above-mentioned problems of the conventional aromatic polyimide, imide oligomer and the resin composition thereof. In more detail, the object of the invention is to provide a thermosetting resin composition which is well soluble in various organic solvents, has a relatively low melting point, is improved in handling and molding, and forms a heat-cured product improved in the heat-resistance and the mechanical property.

The resin composition of the present invention is characterized in that the composition contains a specific resin component as the main component. The resin component consists of:

(A) 100 weight parts of an aromatic polyimide wherein the aromatic polyimide is formed from a tetracarboxylic acid ingredient which contains 2,3,3',4'-biphenyltetracar. boxylic acid or its derivative in an amount of at least 60 mole % and an aromatic diamine ingredient, the polyimide has such a high molecular weight that the logarithmic viscosity measured in concentration of 0.5 g/100 ml using N-methyl-2-pyrrolidone as solvent at temperature of 30° C. is not less than 0.2, and the polyimide is soluble in an organic polar solvent; and (B) (a) 5 to 2,000 weight parts of a terminal-modified imide oligomer, wherein the imide oligomer has an internal imide bond inside of the oligomer and an unsaturated group as a terminal group, the oligomer is formed by a reaction of an aromatic tetracarboxylic acid ingredient, a diamine ingredient, and a monoamine or dicarboxylic acid ingredient having an unsaturated group, and the oligomer has a logarithmic viscosity of not more than 0.5 and a softening point of not higher than 300° C. (preferably in the range of 50° to 300° C.); or (b) 5 to 2,000 weight parts of an unsaturated imide compound wherein the imide compound has an internal imide bond inside of the compound and an unsaturated group, the compound is formed by a reaction of an aromatic tetra-carboxylic acid ingredient with a monoamine ingredient having an unsaturated group, and the compound has a softening point of not higher than 300° C. (preferably in the range of 50° to 300° C.).

Further, the resin solution composition of the invention is characterized in that the resin component mentioned above consisting of (A) 100 weight parts of an aromatic polyimide and (B) 5 to 2,000 weight parts of (a) a terminal-modified imide oligomer or (b) an unsaturated imide compound are uniformly dissolved in an organic polar solvent in concentration from 3 to 50 weight %.

Furthermore, the thermosetting dry film of the fourth invention is characterized in that the film is formed out of the thermosetting resin composition mentioned above, which mainly contains the resin component consisting of (A) 100 weight parts of an aromatic polyimide and (B) 5 to 2,000 weight parts of (a) a terminal-modified imide oligomer or (b) an unsaturated imide compound, and the film has a softening point in the range of 100° to 300° C.

DETAILED DESCRIPTION OF THE INVENTION

The aromatic polyimide used as the resin component of the present invention has a high molecular weight, and is soluble in an organic polar solvent. The aromatic polyimide is formed from a tetracarboxylic acid ingredient which contains 2,3,3',4' -biphenyltetracarboxylic acid or its derivative in an amount of at least 60 mole % (preferably at least 80 mole %, and more preferably 90 to 100 mole %) and an aromatic diamine ingredient. The monomer ingredients (namely, the tetracarboxylic acid ingredient and the an aromatic diamine ingredient) are preferably used in almost equimolecular quantities. The aromatic polyimide is prepared by polymerization and imidization of the monomer ingredients in an organic polar solvent such as a phenol solvent, an amide solvent, a sulfur compound solvent, a glycol solvent or an alkylurea solvent at an elevated temperature (preferably not lower than 140° C.). The polyimide has such a high molecular weight that the logarithmic viscosity (concentration: 0.5 g/100 ml of solvent; solvent: N-methyl 2 pyrrolidone; and temperature of measurement: 30° C.) is not less than 0.2, prefer ably 0.3 to 7, and more preferably 0.5 to 5. The polyimide preferably is uniformly soluble in the organic polar solvent in an concentration of at least 3 weight %, more preferably 5 to 40 weight %.

The soluble aromatic polyimide having a high molecular weight can also be prepared by a conventional imidization of an aromatic polyamic acid having a high molecular weight (i.e., logarithmic viscosity of not less than 0.2). The polyamic acid is prepared by a reaction of the above-mentioned tetracarboxylic acid ingredient with the aromatic diamine ingredient in an organic polar solvent at a low temperature of 0° to 80° C.

The soluble aromatic polyimide having a high molecular weight preferably contains a repeating unit having the following formula (I):

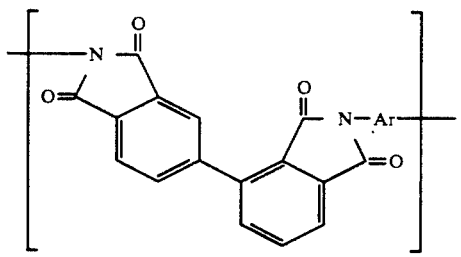

wherein Ar is a divalent aromatic residue which is formed by removing two amino groups from an aromatic diamine.

The aromatic polyimide preferably contains the repeating unit having the formula (I) in an amount of at least 60 mole %, more preferably not less than 80 mole %, and most preferably 90 to 100 mole %. The aromatic polyimide preferably has a high imidization ratio of at least 90%, and more preferably at least 95%. The imidization ratio is measured by infrared spectrum analysis. The aromatic polyimide also preferably has such a high imidization ratio measured by infrared spectrum analysis that the absorption peak with respect to amide-acid bond in the polymer is substantially not observed, and the absorption peak with respect to imide ring is merely observed.

Examples of the above-mentioned 2,3,3',4' -biphenyltetracarboxylic acid or its derivative include 2,3,3',4' -biphenylt acid, dianhydride thereof, a lower alkyl ester thereof and a halide thereof. Particularly, 2,3,3',4' -biphenyltetracarboxylic dianhydride (a-BPDA) is preferred.

If the main component of the thermosetting resin of the present invention, namely 2,3,3',4' -biphenyltetracarboxylic acid or its derivative is replaced by another tetracarboxylic acid, the prepared aromatic polyimide is low in solubility in an organic polar solvent, and is also slightly miscible with the terminal-modified imide oligomer or the unsaturated imide compound used in the present invention. Therefore, it is not preferred that a tetracarboxylic acid other than 2,3,3',4' -biphenyltetracarboxylic acid or its derivative is used as the main component of the thermosetting resin of the present invention.

The 2,3,3',4' -biphenyltetracarboxylic acid or its derivative such as a-BPDA can be used in combination with another tetracarboxylic acid. Examples of the tetracarboxylic acid include 3,3',4,4' -biphenyltetracarboxylic acid, 4,3',4,4' -benzophenonetetracarboxylic acid, 3,3',4,4' -diphenylethertetracarboxylic acid, bis(3,4-dicarboxyphenyl)methane, 2,2-bis(3,4 -dicarboxyphenyl)propane, pyromellitic acid, dianhydrides thereof and esters thereof.

The aromatic diamine ingredient used in preparation of the aromatic polyimide having a high molecular weight preferably is an aromatic diamine compound having at least two (preferably two to five) aromatic rings (such as benzene ring). Examples of the aromatic diamine compound having at least two aromatic rings include biphenyl diamine compounds, diphenyl ether diamine compounds, diphenyl thioether diamine compounds, benzophenone diamine compounds, diphenyl sulfone diamine compounds, bis(phenoxy) propane diamine compounds, biphenylalkane diamine compounds such as diaminodiphenylmethane or its derivative and 2,2-bis(aminophenyl) propane or its derivative, 2,2-bis(3-amino-4-hydroxyphenyl)hexafluoropropane or its derivative, bis-(phenoxy)benzene diamine compounds, 2,2-bis[(phenoxy)-phenyl]propane diamine compounds such as 2,2-bis[4-(4-aminophenoxy)phenyl]propane (BAPP), and bis(phenoxy)diphenyl sulfone diamine compounds. These compounds can be used singly or in combination of two or more compounds as a mixture.

The aromatic diamine ingredient used in preparation of the aromatic polyimide having a high molecular weight more preferably is an aromatic diamine compound having two, three or four benzene rings. Diphenyl ether diamine compounds, diphenylalkane diamine compounds, 2,2-bis(phenoxy)-diphenylpropane diamine compounds and bis(phenoxy)benzene diamine compounds are particularly preferred.

The terminal-modified imide oligomer used in the resin composition of the present invention has an internal imide bond inside of the oligomer of the compound and an unsaturated group as a terminal group. The imide oligomer is formed by a reaction of an aromatic tetracarboxylic acid ingredient, a diamine ingredient, and a monoamine or dicarboxylic acid ingredient having an unsaturated group. The total amount of the acid anhydrides (or pairs of adjacent carboxyl groups) in the ingredients preferably is almost equimolar with the total amount of amines. The aromatic tetracarboxylic acid ingredient, the diamine ingredient, and the monoamine or dicarboxylic acid ingredient are reacted in an organic polar solvent at a temperature of not higher than 100° C. (more preferably 0° to 60° C.) to obtain an oligomer having an amide-acid bond. The obtained oligomer having an amide-acid bond, namely an amic-acid oligomer is heated at 140° to 250° C. to form the terminal modified imide oligomer. The imide oligomer has a softening point of not higher than 300° C., preferably in the range of 50° to 300° C., and more preferably in the range of 100° to 250° C. The oligomer has such a low molecular weight that the logarithmic viscosity is not more than 0.5, preferably 0.01 to 0.4, and more preferably 0.01 to 0.3.

The terminal-modified imide oligomer preferably has the following formula (II) or (III):

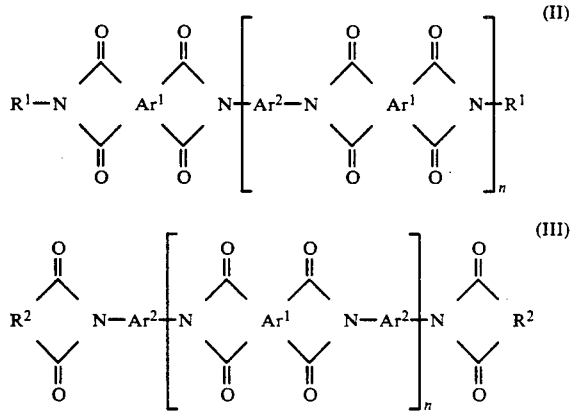

wherein Ar¹ is a quadrivalent aromatic residue which is formed by removing four carboxyl groups from an aromatic tetracarboxylic acid; Ar² is a divalent organic residue which is formed by removing two amino groups from a diamine compound; R¹ is a monovalent organic residue which is formed by removing one amino group from a monoamine compound having an unsaturated group; R² is a divalent organic residue which is formed by removing two carboxyl groups from a dicarboxylic acid having an unsaturated group; and "n" is an integer of 1 to 50, preferably 1 to 30.

The terminal-modified imide oligomer preferably has such a high imidization ratio measured by infrared spectrum analysis that the absorption peak with respect to amide-acid bond in the oligomer is substantially not observed, and the absorption peak with respect to imide ring is merely observed.

The aromatic tetracarboxylic acid ingredient and the diamine ingredient used in preparation of the terminal-modified imide oligomer are analogous to the examples of the ingredients used in preparation of the above-mentioned aromatic polyimide having a high molecular weight.

In preparation of the terminal-modified imide oligomer, biphenyltetracarboxylic acids such as 2,3,3',4' biphenyltetracarboxylic acid, 3,3',4,4' -biphenyltetracarboxylic acid, dianhydrides thereof and esters thereof are preferably used as the aromatic tetracarboxylic acid ingredient. Further, aromatic tetracarboxylic acids such as benzophenonetetracarboxylic acids, biphenylethertetracarboxylic acids, bis(3,4-dicarboxyphenyl)benzenes, 2,2-bis(3,4-dicarboxyphenyl)propanes, pyromellitic acids and dianhydrides thereof are also preferably available. Dianhydrides are particularly preferred. These acids can be used singly or in combination of two or more acids as a mixture.

Further, in preparation of the terminal-modified imide oligomer, the diamine ingredient preferably is an aromatic diamine compound having two, three or four benzene rings. Examples of the aromatic diamine compound include diphenyl ether diamine compounds, diphenylalkane diamine compounds, 2,2-bis(phenoxy)-diphenylpropane diamine compounds, biphenyl diamine compounds and bis(phenoxy)benzene diamine compounds. Aliphatic diamine compounds such as 1,3-diamino-2-hydroxypropane, diaminoethane, diaminopropane, diaminobutane and diaminopentane are also available. These compounds can be used singly or in combination of two or more compounds as a mixture.

Furthermore, in preparation of the terminal-modified imide oligomer, the monoamine ingredient preferably is (i) an aliphatic monoamine compound having an unsaturated group or (ii) an aromatic monoamine compound having an unsaturated group.

Examples of (i) the aliphatic monoamine compound having an unsaturated group include propargyl amine (PA), 3-aminobutyne, 4-aminobutyne, 5-aminopentyne, 4-aminopentyne, 6-aminohexyne, 7-aminoheptyne, 4-amino- 3-methylbutyne and allylamine. Examples of (ii) the aromatic monoamine compound having an unsaturated group include m- or p-aminostyrene, m-amino-α-methylstyrene, 1-isopropenyl-3-(2-aminoisopropyl)benzene, 3-aminophenylacetylene and 4-aminophenylacetylene.

As the dicarboxylic acid ingredient having an unsaturated group, unsaturated dicarboxylic acids having adjacent two carboxyl groups are preferably available. Examples of the unsaturated dicarboxylic acids having adjacent two car boxyl groups include (a) maleic acid, anhydride thereof (maleic anhydride: MA) and an ester thereof; (b) nadic acid, anhydride thereof (nadic anhydride: NA) and an ester thereof; (c) itaconic acid, anhydride thereof (itaconic an hydride) and an ester thereof; and (d) tetrahydrophthalic acid, anhydride thereof (tetrahydrophthalic anhydride: HA) and an ester thereof.

The organic polar solvent used in preparation of the aromatic polyimide having a high molecular weight is also available in preparation of the terminal-modified imide oligomer. Examples of the organic polar solvent include an amide solvent such as N,N-dimethylacetamide, N,N-diethylacetamide, N,N-dimethylformamide, N,N-diethylformamide and N-methyl-2-pyrrolidone; a sulfur compound solvent such as dimethyl sulfoxide, diethyl sulfoxide, dimethyl sulfone, diethyl sulfone and hexamethylsulfonamide; a phenol solvent such as cresol, phenol and xylenol; an oxygen compound solvent such as acetone, methanol, ethylene glycol, dioxane and tetrahydrofuran; and the other solvents such as pyridine and tetramethylurea. If necessary, the organic polar solvent can be used in combination with the other organic solvents such as an aromatic hydrocarbon solvent (e.g., benzene, toluene and xylene), solvent naphtha and benzyl nitrile.

The unsaturated imide compound used in the resin composition of the present invention has an internal imide bond inside of the compound and an unsaturated group. The imide compound is formed by a reaction of an aromatic tetracarboxylic acid ingredient with a monoamine ingredient having an unsaturated group. The total amount of the acid anhydrides (or pairs of adjacent carboxyl groups) in the ingredients preferably is almost equimolar with the total amount of amines. The aromatic tetracarboxylic acid ingredient is reacted with the monoamine ingredient in an organic polar solvent at a temperature of not higher than 100° C. (more preferably 0° to 60° C.) to obtain a compound having an amide-acid bond. The obtained compound having an amide-acid bond is heated at 140° to 250° C. to form the terminal modified imide oligomer. The imide compound has a softening point of not higher than 300° C., preferably in the range of 50° to 300° C., and more preferably in the range of 100° to 250° C.

The unsaturated imide compound preferably has the following formula (IV):

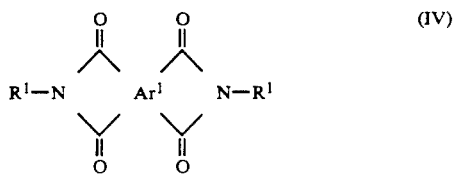

wherein $Ar^1$ and $R^1$ have the same meanings as for $Ar^1$ and $R^1$ in the formula (II).

The tetracarboxylic acid ingredient and the monoamine ingredient having an unsaturated group used in preparation of the unsaturated imide compound are analogous to the examples of the ingredients used in preparation of the above-mentioned terminal-modified imide oligomer. Biphenyltetra carboxylic acids such as 2,3,3',4' -biphenyltetracarboxylic acid, 3,3',4,4' -biphenyltetracarboxylic acid, dianhydrides thereof and esters thereof are preferably used as the aromatic tetracarboxylic acid ingredient. The monoamine ingredient having an unsaturated group preferably is an aliphatic monoamine compound having an unsaturated group such as propargyl amine.

The thermosetting resin composition of the present invention contains a specific resin component as the main component (preferably in an amount of at least 90 weight %, and more preferably 95 to 100 weight %). The resin component consists of:

(A) 100 weight parts of the aromatic polyimide; and
(B) 5 to 2,000 weight parts (preferably 10 to 1,000 weight parts, and more preferably 30 to 300 weight parts) of (a) the terminal-modified imide oligomer or (b) the unsaturated imide compound.

If the amount of the terminal-modified imide oligomer or the unsaturated imide compound is extremely small in the resin composition of the invention, the adhesiveness is lowered. Further, if the amount of the imide oligomer or compound is extremely large, the mechanical property is lowered.

In the solution composition of a thermosetting resin of the invention, the resin component mentioned above consisting of 100 weight parts of the aromatic polyimide and 5 to 2,000 weight parts of the terminal-modified imide oligomer or the unsaturated imide compound are uniformly dissolved in an organic polar solvent in concentration from 3 to 50 weight %, more preferably from 5 to 40 weight %.

The organic polar solvents used in preparation of the terminal-modified imide oligomer are also available in the resin solution composition. An organic polar solvent containing oxygen in the molecule such as dioxane and tetrahydrofuran is particularly preferred.

The solution composition of the invention preferably has a solution viscosity (rotating viscosity) of about 0.1 to 20,000 poise, and more preferably 0.1 to 10,000 poise at about 30° C.

The dry film of the present invention is formed out of the above-mentioned thermosetting resin composition. The film preferably is a self-supporting film having a thickness of 0.1 to 100 μm, and more preferably 0.5 to 50 μm. The film has a softening point in the range of 100° to 300° C., and preferably 120° to 280° C. The film is preferably heat-cured at a temperature of about 150° to 400° C., and more preferably 180° to 350° C.

The dry film of the invention can be heat-cured to form a heat-resistant film. Therefore, the film can be inserted between various metal foil and heat-resistant film materials to prepare a highly heat-resistant composite wherein the foil and film strongly adhere to each other The dry film can be prepared by spreading the solution composition of the thermosetting resin on a smooth support to form a thin membrane of the solution composition, and drying the membrane under atmospheric or reduced pressure at a temperature of not higher than 200° C. (preferably 60° to 180° C.) for about 1 to 240 minutes (preferably 1.5 to 180 minutes) to evaporate and remove the organic polar solvent.

EXAMPLES

The present invention is described in more detail by the following examples.

In the examples, the logarithmic viscosity (η inh) is the value determined as follows. A resin component was homogeneously dissolved in N-methyl-2-pyrrolidone to prepare a resin solution having a resin concentration of 0.5 g/100 ml of solvent. The solution viscosity of the resin solution and the viscosity of the solvent only were measured at 30° C., and the obtained values were introduced into the following equation to calculate the logarithmic viscosity.

$$\text{Logarithmic Viscosity } (\eta \text{ inh}) = \frac{\ln\left(\frac{\text{Viscosity of Solution}}{\text{Viscosity of Solvent}}\right)}{\text{Concentration of Solvent}}$$

The bond strength of lamination was measured by T-shaped peeling test at peeling rate of 50 mm/min using a tensile tester of Intesco Co.

Further, the softening point of the dry film was determined by heating two films under atmospheric pressure on a hot plate and examining whether the films adhere to each other.

EXAMPLE 1

Preparation of terminal-modified imide oligomer

Into a 300 ml-volume glass flask were charged (a) 14.71 g (0.05 mole) of 2,3,3',4' -biphenyltetracarboxylic dianhydride (a-BPDA), (b) 29.23 g (0.1 mole) of 1,3-bis(4-aminophenoxy)benzene (TPE-R) and (c) 175.76 g of dimethylacetamide (DMAc). They were stirred at 50° C. for 1 hour in nitrogen gas stream to produce an amic acid oligomer. The resulting reaction solution was heated to about 165° C. and stirred for 3 hours at the same temperature to produce an imide oligomer having a terminal amino group.

The reaction solution was cooled to 50° C. Then, to the solution were added 11.77 g (0.12 mole) of maleic anhydride and 35 g of xylene. The resulting solution was heated to 160° C. and stirred for 4 hours to remove xylene and formed water. Thus an imide oligomer having an unsaturated group as a terminal group was formed. The reaction solution was cooled to room temperature (about 20° C.), and then poured into water to deposit powdery imide oligomer. The powder of the imide oligomer was collected by filtration, and washed twice with methanol at 25° C. The powder was dried under reduced pressure to obtain a terminal-modified imide oligomer.

The imidization ratio of the obtained terminal-modified imide oligomer was not less than 95%, and the logarithmic viscosity was 0.04.

Preparation of aromatic polyimide

Into a 300 ml-volume glass flask were charged (a) 29.42 g (0.1 mole) of 2,3,3'4'-biphenyltetracarboxylic dianhydride (a-BPDA), (b) 41.07 g (0.1 mole) of 2,2-bis[4-(4-aminophenoxy)phenyl]propane (BAPP) and (c) 300 g of N methy-2-pyrrolidone (NMP). They were stirred at 50° C. for 1 hour in nitrogen gas stream to produce an amic acid oligomer. The resulting reaction solution was heated to about 190° C. and stirred for 5 hours at the same temperature to produce an aromatic polyimide.

According to a wet spinning process, fibers were extruded at room temperature (about 20° C.) from the reaction solution into water of a temperature of lower than room temperature. The fibers were washed twice with methanol at 25° C., and dried under reduced pressure to obtain aromatic polyimide fibers (diameter: 200 $\mu$m).

The imidization ratio of the obtained aromatic polyimide was not less than 95%, and the logarithmic viscosity was 0.41.

Preparation of thermosetting resin composition

Into a flask of 300 ml were charged 5 g of the terminal-modified imide oligomer, 5 g of the aromatic polyimide fibers and 40 g of 1,4 dioxane. They were stirred at room temperature (25 ° C) for 2 hours to prepare a uniform solution composition of a thermosetting resin.

The solution composition was kept uniform after the composition was left for 1 week.

Preparation of dry film

The solution composition was spread on a glass plate to form a thin membrane, and dried at 90° C. for 30 minutes and then 140° C. for 30 minutes. The membrane was peeled from the glass plate to obtain a thermosetting dry film having thickness of 20 $\mu$m.

The softening point of the dry film is set forth in Table 1.

Preparation of thermally heat-cured product of dry film

The dry film was heated at 250° C. for 2 hours in a circulating air drying machine. Thus the dry film was heat-cured to obtain a heat-resistant film.

With respect to the obtained heat-cured heat-resistant film, the mechanical property (tensile strength, modulus of elasticity and elongation percentage) and the heat-resistance (temperature of 5 weight % thermal decomposition) were measured. The results are set forth in Table 1.

Adhesion test of thermosetting composition

The solution composition of the thermosetting resin was spread on copper foil having thickness of 30 $\mu$m, and dried at 90° C. for 30 minutes and then 140° C. for 30 minutes to form a thin membrane of the dried thermoset resin composition (thickness: 20 $\mu$m).

A polyimide film having thickness of 25 $\mu$m (UPILEX, S type, produced by Ube Industries, Ltd.) was placed on the thin membrane of the thermosetting resin formed on copper foil. They were then pressed at 200° C. under pressure of 20 kg/cmz for 5 minutes to obtain a lamination. The lamination was heated at 200° C. for 6 hours in a circulating air drying machine to thermally harden the thermosetting resin composition.

The bond strength of the obtained lamination was measured. The results are set forth in Table 1.

EXAMPLES 2 AND 3

Thermosetting resin compositions and dry films were prepared in the same manner as in Example 1, except that 7 g of the terminal-modified imide oligomer and 3 g of the aromatic polyimide fibers were used (Example 2), or 3 g of the terminal-modified imide oligomer and 7 g of the aromatic polyimide fibers were used (Example 3).

The obtained materials were evaluated in the same manner as in Example 1. The results are set forth in Table 1.

EXAMPLE 4

Into a 300 ml-volume glass flask were charged (a) 14.71 g (0.05 mole) of 2,3,3'4'-biphenyltetracarboxylic dianhydride (a-BPDA), (b) 43.25 g (0.1 mole) of bis[4-(4-aminophenoxy)phenyl]sulfone (BAPS) and (c) 175.76 g of dimethylacetamide (DMAc). They were stirred at 50° C. for 1 hour in nitrogen gas stream to produce an amic acid oligomer. The resulting reaction solution was heated to about 165° C. and stirred for 3 hours at the same temperature to produce an imide oligomer having a terminal amino group.

The reaction solution was cooled to 50° C. Then, to the solution were added 11.77 g (0.12 mole) of maleic anhydride and 35 g of xylene. The resulting solution was heated to 160° C. and stirred for 4 hours to remove xylene and formed water. Thus an imide oligomer having an unsaturated group as a terminal group was formed. The reaction solution was cooled to room temperature (about 20° C.), and then poured into water to deposit powdery imide oligomer. The powder of the imide oligomer was collected by filtration, and washed twice with methanol at 25° C. The powder was dried under reduced pressure to obtain a terminal-modified imide oligomer.

The imidization ratio of the obtained terminal-modified imide oligomer was not less than 95%, and the logarithmic viscosity was 0.04.

A thermosetting resin composition and a dry film were prepared in the same manner as in Example 1, except that the above-prepared terminal-modified imide oligomer was used.

The obtained materials were evaluated in the same manner as in Example 1. The results are set forth in Table 1.

Comparison Example 1

A dry film and a lamination of copper foil and an aromatic polyimide film was prepared in the same manner as in Example 1, except that only 10 g of the aromatic polyimide in Example 1 was used in place of the resin composition.

The obtained materials were evaluated in the same manner as in Example 1. The results are set forth in Table 1.

TABLE 1

|  | Softening Point of Dry Film (°C.) | Nature of Thermosetting Resin Tg (°C.) | Bond Strength of Lamination | |
|---|---|---|---|---|
|  |  |  | 20° C. (kg/cm) | 200° C. (kg/cm) |
| Example 1 | 200 | 260 | 1.5 | 1.1 |
| Example 2 | 210 | 255 | 1.4 | 1.0 |
| Example 3 | 198 | 255 | 0.9 | 0.9 |
| Example 4 | 205 | 255 | 1.0 | 1.0 |
| Comp. Ex. 1 | 300< | 252 | 0.05 | — |

|  | Nature of Thermosetting Film | | | |
|---|---|---|---|---|
|  | Heat-resistance Temperature of 5% Reduction (°C.) | Mechanical Strength | | |
|  |  | Tensile Strength (kg/cm$^2$) | Modulus of Elasticity (kg/cm$^2$) | Elongation Percentage (%) |
| Example 1 | 490 | 15.3 | 277 | 10.7 |
| Example 2 | 488 | 11.5 | 230 | 12.5 |
| Example 3 | 480 | 14.2 | 301 | 8.3 |
| Example 4 | 485 | 14.8 | 240 | 11.2 |
| Comp. Ex. 1 | 507 | 11.0 | 200 | 58.0 |

Remark: At the measurement of the softening point of the dry film in Comparison Example 1, a clear softening point was not observed at a temperature of lower than 300° C.

EXAMPLE 5

In 40 g of 1,4.dioxane were dissolved 2.5 g of the terminal-modified imide oligomer, 7.5 g of the aromatic polyimide prepared in Example 1 to prepare a solution composition of a thermosetting resin. The obtained solution composition was spread on a glass plate, and dried at 90° C. for 30 minutes and then 140° C. for 30 minutes in an oven to form a dry film having thickness of 20 μm.

The softening point of the dry film was 200° C.

Six sheets of the film was laminated, and the lamination was pressed under pressure of 20 kg/cmz at 240 C. for 1 hour and then at 270° C. for 20 minutes to thermally harden the resin. Thus a flexible lamination sheet having thickness of 100 μm was obtained.

The thermal character of the lamination was measured. As the results, the glass transition point (Tg) was 250° C., and the temperature of 5 weight % thermal decomposition was 480° C.

EXAMPLE 6

Into a 300 ml-volume glass flask were charged (a) 29.42 g (0.1 mole) of 2,3,3'4'-biphenyltetracarboxylic dianhydride (a-BPDA), (b) 14.62 g (0.05 mole) of 1,3-bis(4-aminophenoxy)benzene (TPE-R) and (c) 180 g of N-methyl 2-pyrrolidone (NMP). They were stirred at 50° C. for 1 hour in nitrogen gas stream to produce an amic acid oligomer. The resulting reaction solution was heated to about 165° C. and stirred for 3 hours at the same temperature to produce an imide oligomer having a terminal carboxyl group.

The reaction solution was cooled to 50° C. Then, to the solution was added 5.51 g (0.1 mole) of propargyl amine. The resulting reaction solution was stirred at 50° C. for 1 hour, and heated to 200° C. and stirred for 2 hours to form an imide oligomer having an unsaturated group as a terminal group. The reaction solution was cooled to room temperature, and then poured into water to deposit powdery imide oligomer. The powder of the imide oligomer was collected by filtration, and washed twice with methanol at 25° C. The powder was dried under reduced pressure to obtain powder of a terminal-modified imide oligomer.

The imidization ratio of the obtained terminal-modified imide oligomer was not less than 95 %, and the logarithmic viscosity was 0.05.

A thermosetting resin composition and a dry film were prepared in the same manner as in Example 1, except that the above-prepared terminal-modified imide oligomer was used.

The solution composition of the thermosetting resin was spread on copper foil having thickness of 30 μm, and dried at 160° C. for 30 minutes to form a thin membrane of the dried thermosetting resin composition (thickness: 20 μm) the copper foil.

A polyimide film having thickness of 25 μm (UPILEX, R-type, produced by Ube Industries, Ltd.) was placed on the thin membrane of the thermosetting resin formed on copper foil. They were then pressed at 220° C. under pressure of 20 kg/cm for 5 minutes to obtain a lamination. The lamination was heated at 300° C. for 6 hours in a circulation air drying machine to thermally harden the thermosetting resin composition.

The bond strength of the obtained lamination was 790 g/cm (at room temperature).

EXAMPLE 7

Into a 300 ml-volume glass flask were charged (a) 29.42 g (0.1 mole) of 2,3,3'4'-biphenyltetracarboxylic dianhydride (a-BPDA), (b) 11.02 g (0.2 mole) of propargyl amine and (c) 180 g of N-methyl-2-pyrrolidone (NMP). They were stirred at 50° C. for 1 hour in nitrogen gas stream. The resulting reaction solution was heated to about 200° C. and stirred for 2 hours at the same temperature to produce an imide compound having an unsaturated group. The reaction solution was cooled to room temperature, and then poured into methanol of 25° C. to deposit a powdery unsaturated imide compound. The powder was washed twice with water and dried under reduced pressure to obtain powder of an unsaturated imide compound.

The obtained unsaturated imide compound was examined using infrared spectrum analysis. As the result, a peak with respect to imide ring was observed.

A thermosetting resin composition and a dry film were prepared in the same manner as in Example 1, except that the above-prepared unsaturated imide compound was used.

The solution composition of the thermosetting resin was spread on copper foil having thickness of 30 μm, and dried at 160° C. for 30 minutes to form a thin membrane of the dried thermosetting resin composition (thickness: 20 μm) on the copper foil.

A polyimide film having thickness of 25 μm (UPILEX, R. type, produced by Ube Industries, Ltd.) was placed on the thin membrane of the thermosetting resin formed on copper foil. They were then pressed at 220°C. under pressure of 20 kg/cmz for 5 minutes to obtain a lamination. The lamination was heated at 300° C. for 6 hours in a circulating air drying machine to thermally harden the thermosetting resin composition.

The bond strength of the obtained lamination was 860 g/cm (at room temperature).

COMPARISON EXAMPLE 2

A lamination of copper foil and an aromatic polyimide film was prepared in the same manner as in Example 1, except that only 10 g of the terminal-modified imide oligomer in Example 1 was used in place of the resin composition.

When the obtained lamination was folded, many cracks were formed on the adhesive layer made of the terminal-modified imide oligomer. Therefore, the lamination was not appropriate for practical use.

COMPARISON EXAMPLE 3

An aromatic polyimide (logarithmic viscosity: 0.5) was prepared in the same manner as in Example 1, except that 3,3'4,4'-benzophenonetetracarboxylic dianhydride was used as a tetracarboxylic acid ingredient. In preparation of the polyimide, granular polymer was deposited at the reaction of imidization.

The obtained aromatic polyimide is low in solubility in 1,4-dioxane, and is not well miscible with the terminal-modified imide oligomer. Therefore, it was difficult to prepare a uniform solution composition of the thermosetting resin using the obtained polyimide.

EFFECT OF THE INVENTION

The thermosetting resin of the present invention can be heat-cured at about 180° to 400° C. The resin is so soluble in various organic polar solvents that it is easy to prepare a solution composition of a thermosetting resin.

Further, the thermosetting resin composition of the invention has such a melting point that the composition is advantageously used as a heat-resistant adhesive. Further, the melting point of the composition is convenient for molding. Furthermore, the composition of the invention can be advantageously used as an excellent heat-resistant adhesive for preparation of various composites (such as a composite of polyimide film and copper foil or copper wire), since the heat-cured product made from the thermosetting resin composition containing an aromatic polyimide having a high molecular weight shows an excellent mechanical property.

The dry film of the invention is not only thermosetting but also heat-resistant after the film is heat-cured. Therefore, two or more sheets of the film can be laminated to prepare a heat-resistant lamination. The film can also be inserted between metal foil and a heat-resistant film as an adhesive dry film to easily prepare a heat-resistant lamination of metal foil.

We claim:

1. A thermosetting resin composition characterized in that the composition contains a resin component as the main component, said resin component consisting of 100 weight parts of an aromatic polyimide and 5 to 2,000 weight parts of a terminal-modified imide oligomer, wherein the aromatic polyimide is formed from a tetracarboxylic acid ingredient which contains 2,3,3',4'-biphenyltetracarboxylic acid or its derivative in an amount of at least 60 mole % and an aromatic diamine ingredient, said polyimide having such a high molecular weight that the logarithmic viscosity measured at concentration of 0.5 g/100 ml using N-methyl 2-pyrrolidone as solvent at temperature of 30° C. is not less than 0.2, and said polyimide being soluble in an organic polar solvent, and wherein the imide oligomer has an internal imide bond inside of the oligomer and an unsaturated group as a terminal group, and is formed by a reaction of an aromatic tetracarboxylic acid ingredient, a diamine ingredient, and a monoamine or dicarboxylic acid ingredient having an unsaturated group, said oligomer having a logarithmic viscosity of not more than 0.5 and a softening point of not higher than 300° C.

2. The thermosetting resin composition as claimed in claim 1, wherein the aromatic polyimide contains a repeating unit having the formula (I) in an amount of at least 60 mole %:

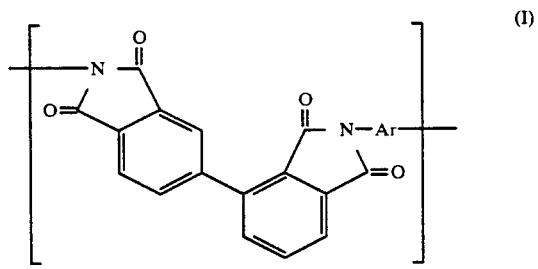

wherein Ar is a divalent aromatic residue which is formed by removing two amino groups from an aromatic diamine.

3. The thermosetting resin composition as claimed in claim 1, wherein the terminal-modified imide oligomer has the formula (II):

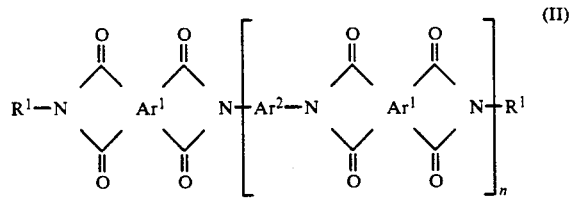

wherein $Ar^1$ is a quadrivalent aromatic residue which is formed by removing four carboxyl groups from an aromatic tetracarboxylic acid; $Ar^2$ is a divalent organic residue which is formed by removing two amino groups from a diamine compound; $R^1$ is a monovalent organic residue which is formed by removing one amino group from a monoamine compound having an unsaturated group; and "n" is an integer of 1 to 50.

4. The thermosetting resin composition as claimed in claim 1, wherein the terminal-modified imide oligomer has the formula (III):

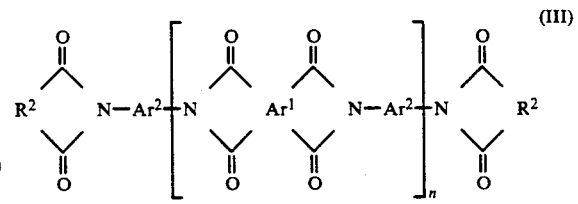

wherein $Ar^1$ is a quadrivalent aromatic residue which is formed by removing four carboxyl groups from an aromatic tetracarboxylic acid; $Ar^2$ is a divalent organic residue which is formed by removing two amino groups from a diamine compound; $R^2$ is a divalent organic residue which is formed by removing two carboxyl groups from a dicarboxylic acid having an unsaturated group; and "n" is an integer of 1 to 50.

5. A thermosetting resin composition characterized in that the composition contains a resin component as the main component, said resin component consisting of 100 weight parts of an aromatic polyimide and 5 to 2,000 weight parts of an unsaturated imide compound, wherein the aromatic polyimide is formed from a tetracarboxylic acid ingredient which contains 2,3,3',4'-biphenyltetracarboxylic acid or its derivative in an amount of at least 60 mole % and an aromatic diamine ingredient, said polyimide having such a high molecular weight that the logarithmic viscosity measured at concentration of 0.5 g/100 ml using N-methyl-2-pyrrolidone as solvent at temperature of 30° C. is not less than 0.2, and said polyimide being soluble in an organic polar solvent, and wherein the imide compound has an internal imide bond inside of the compound and an unsaturated group, and is formed by a reaction of an aromatic tetracarboxylic acid ingredient with a monoamine ingredient having an unsaturated group, said compound having a softening point of not higher than 300° C.

6. The thermosetting resin composition as claimed in claim 5, wherein the aromatic polyimide contains a repeating unit having the formula (I) in an amount of at least 60 mole %:

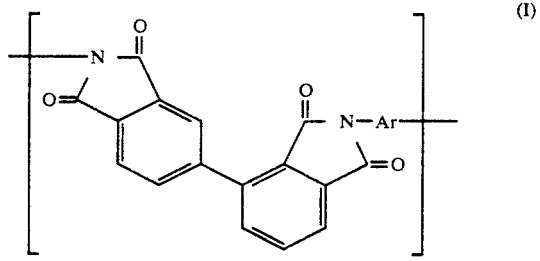

(I)

wherein Ar is a divalent aromatic residue which is formed by removing two amino groups from an aromatic diamine.

7. The thermosetting resin composition as claimed in claim 1, wherein the unsaturated imide compound has the formula (IV):

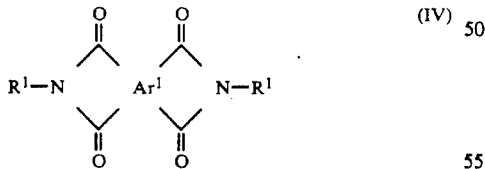

(IV)

wherein Ar₁ is a quadrivalent aromatic residue which is formed by removing four carboxyl groups from an aromatic tetracarboxylic acid; and $R^1$ is a monovalent organic residue which is formed by removing one amino group from a monoamine compound having an unsaturated group.

8. A solution composition of a thermosetting resin characterized in that a resin component consisting of 100 weight parts of an aromatic polyimide and 5 to 2,000 weight parts of a terminal-modified imide oligomer is uniformly dissolved in an organic polar solvent in concentration from to 50 weight %, wherein the aromatic polyimide is formed from a tetracarboxylic acid ingredient which contains 2,3,3',4'-biphenyltetracarboxylic acid or its derivative in an amount of at least 60 mole % and an aromatic diamine ingredient, said polyimide having such a high molecular weight that the logarithmic viscosity measured at concentration of 0.5 g/100 ml using N-methyl-2-pyrrolidone as solvent at temperature of 30° C. is not less than 0.2, and said polyimide being soluble in an organic polar solvent, and wherein the imide oligomer has an internal imide bond inside of the oligomer and an unsaturated group as a terminal group, and is formed by a reaction of an aromatic tetracarboxylic acid ingredient, a diamine ingredient, and a monoamine or dicarboxylic acid ingredient having an unsaturated group, said oligomer having a logarithmic viscosity of not more than 0.5 and a softening point of not higher than 300° C.

9. The solution composition as claimed in claim 8, wherein the organic polar solvent is selected from the group consisting of an amide solvent, a sulfur compound solvent, a phenol solvent and an oxygen compound solvent.

10. The solution composition as claimed in claim 8, wherein the organic polar solvent is an oxygen compound solvent.

11. A solution composition of a thermosetting resin characterized in that a resin component consisting of 100 weight parts of an aromatic polyimide and 5 to 2,000 weight parts of an unsaturated imide compound is uniformly dissolved in an organic polar solvent in concentration from 3 to 50 weight %, wherein the aromatic polyimide is formed from a tetracarboxylic acid ingredient which contains 2,3,3',4'-biphenyltetracarboxylic acid or its derivative in an amount of at least 60 mole % and an aromatic diamine ingredient, said polyimide having such a high molecular weight that the logarithmic viscosity measured at concentration of 0.5 g/100 ml using N-methyl-2-pyrrolidone as solvent at temperature of 30° C. is not less than 0.2, and said polyimide being soluble in an organic polar solvent, and wherein the imide compound has an internal imide bond inside of the compound and an unsaturated group, and is formed by a reaction of an aromatic tetracarboxylic acid ingredient with a monoamine ingredient having an unsaturated group, said compound having a softening point of not higher than 300° C.

12. The solution composition as claimed in claim 10, wherein the organic polar solvent is selected from the group consisting of an amide solvent, a sulfur compound solvent, a phenol solvent and an oxygen compound solvent.

13. The solution composition as claimed in claim 10, wherein the organic polar solvent is an oxygen compound solvent.

* * * * *